United States Patent [19]

Kinbara

[11] 4,186,298
[45] Jan. 29, 1980

[54] METHOD FOR CONVERTING INPUT ANALOG SIGNALS TO TIME SIGNALS AND THE TIME SIGNALS TO DIGITAL VALUES

[75] Inventor: Setsuro Kinbara, Mito, Japan

[73] Assignee: Japan Atomic Energy Research Institute, Tokyo, Japan

[21] Appl. No.: 798,570

[22] Filed: May 19, 1977

[30] Foreign Application Priority Data

Jun. 11, 1976 [JP] Japan .................................. 51/68416
Jun. 11, 1976 [JP] Japan .................................. 51/68417

[51] Int. Cl.² .................. G04F 11/06; H03K 13/02
[52] U.S. Cl. ........................... 235/92 T; 340/347 M;
340/347 CC; 235/92 TF; 328/129
[58] Field of Search ............... 340/347 NT, 347 AD,
340/347 CC, 347 M; 324/78 D, 99 D; 328/48,
129; 235/92 T, 92 TF, 92 FQ

[56] References Cited

U.S. PATENT DOCUMENTS

| 3,445,839 | 5/1969 | Engelberg et al. ........... 340/347 CC |
| 3,711,851 | 1/1973 | Giraud et al. ................ 340/347 NT |
| 3,938,042 | 2/1976 | Gliever et al. .................... 328/129 X |

Primary Examiner—Thomas J. Sloyan
Attorney, Agent, or Firm—Oblon, Fisher, Spivak, McClelland & Maier

[57] ABSTRACT

In a method for converting input analog signals to time signals and the time signals thus obtained to digital values, an arbitrary value is preset in a scaler as an offset prior to effecting a conversion and counting and the conversion and counting is effected by the time signals. A value the same as the preset value is digitally added, after the conversion and counting, to a counter in a direction in that the preset value is cancelled. The differential non-linearity is actually improved by varying the preset value every conversion and counting.

5 Claims, 7 Drawing Figures

METHOD FOR CONVERTING INPUT ANALOG SIGNALS TO TIME SIGNALS AND THE TIME SIGNALS TO DIGITAL VALUES

BACKGROUND OF THE INVENTION

This invention relates to an analog-to-digital converting method and, more particularly, to an analog-to-digital converting (ADC) method that is mainly used in pulse-height analyzers.

This invention aims, in a converting system wherein an analog signal is once converted into a time signal and, thereafter, the time signal is converted into a digital value, to achieve improvement in the conversion characteristics and increase the conversion ability. Furthermore, the construction of a time-to-digital conversion of this invention can, as itself, be applied to increase the conversion ability of a time analyzer used as a time-to-digital converting (TDC) circuit.

In the TDC circuit, such as a pulse-height analyzer, used as an instrument wherein a number of input signals are continuously measured and wherein the result of measurements is summed to make a histogram to obtain a measurement resultant, it is an absolutely inevitable condition to establish good integral non-linearity as well as good differential non-linearity that denotes the uniformity that the width of each channel ("channel" is, hereinafter referred to as a digitalized value) occupies on the abscissa of the histogram.

A counting process, which is generally referred to as Wilkinson process in the nuclear field, for gating clock-pulses by the time signals is generally used in order to obtain good differential non-linearity. However, the differential non-linearity is deteriorated due to some causes as the frequency of the clock-pulses is expedited due to a request for quickening the conversion time, and, therefore, the process cannot be practically used when the differential non-linearity exceeds an allowable limit.

In an ADC circuit of the prior art, as shown in FIG. 1, wherein analog signals are converted into time signals and clock-pulses are gated by the time signals, the clock-pulses are obtained accurately and this method can basically provide good differential non-linearity. Therefore, no countermeasure is normally considered to maintain the good differential non-linearity.

This causes the differential non-linearity to be deteriorated due to some interfering action as the frequency of the clock-pulses is expedited. The interfering action is brought about in the TDC in FIG. 1 and the period of the clock-pulses is disturbed due to the interfering action of the operation in every order of a scaler at every clock-pulse. This is discussed in more detail in the following:

For example, in the circuit shown in FIG. 2, where the TDC is effected by a binary scaler, time signals are applied to a gate 4 from a terminal 1 and clock-pulses obtained from a clock oscillator 2 are also applied to gate 4 from a terminal 3. The clock-pulses are gated at gate 4 to provide outputs at a terminal 5 and the outputs are applied to a scaler 6 to be counted. Digital values are obtained at a terminal 7 as the outputs of scaler 6 which are proportional to the time signals.

During these operations, a first stage binary 8 of scaler 6 induces at a terminal 9 an output of period of twice the clock-pulses applied at terminal 5. An output of period of four times the clock-pulses is induced at a terminal 11 by a second stage binary 10 of scaler 6 so that a so-called binary counting operation is effected.

First stage binary 8 has a period of twice the clock-pulses, as stated above, and the pulses of twice period trigger second stage binary 10 and, at the same time, provide an action of interference to clock oscillator 2, terminal 3, terminal 5 and gate 4 from first stage binary 8. An action of interference, similar to the above, is provided in the binary which is in and after second stage binary 10 so that an action of interference of a period of four times and eight times, etc., the clock-pulses are provided on terminal 3.

Thus, the period of the clock-pulses are naturally disturbed by receiving an induction of low frequency component and, for example, when a low frequency component of twice period is induced by the first stage binary, a wide period and a narrow period will alternately be generated every other cycle. If the clock-pulses are gated by such unbalanced period the probability that the scaler stops after termination of counting will naturally be higher in the range that the wide period appears. Thus an unbalance in ratio where an even number and an odd number appear naturally exists in the digital value thus obtained. A phenomenon similar to the above will be brought about in and after the second stage binary of the scaler so that the resultant action of interference deteriorates the differential linearity.

The degree of the action of interference varies in accordance with the sort of elements used, amplitudes of element signals, propagation time in the elements, arrangement of circuits or construction of circuits and the higher the rate of the clock-pulses the larger the degree of the action of interference so the differential linearity is accordingly deteriorated.

The known countermeasure taken in order to solve these problems is that the gate is made to open and close in synchronization with the clock-pulses to assure the operation of the gate or that the scaler is triggered by an output coming from a binary which is added after the gate circuit. In the former, the gate operation can be synchronized with the clock-pulses but the ending time of the time signal occurs at an arbitrary relation to the phase of the clock-pulses so that it is difficult to provide a complete operation and, moreover, when the period of the clock-pulses applied to the gate is disturbed the unbalance in the digital values remains unsolved. In the latter, the odd-even unbalance which is the most affective is avoided to some degree but the action of interference coming from the first stage binary or the second stage binary or any further stage binaries in the scaler is not only solved but it becomes necessary to operate the clock oscillator and the gates at a speed of twice that of the scaler. Moreover, it is necessary to use high speed elements when the scaler is operating at a high speed so that a number of bad influences remain unsolved.

Furthermore, the frequencies of the clock-pulses are generally limited to below the highest operating speed of one or more of the high speed elements.

The present status is, as stated above, that it is compromised to lower the rate of the clock-pulses within a range that the differential non-linearity is allowable to effect a time-to-digital conversion, since there is a limit in raising the rate of the clock-pulses in view of the differential non-linearity.

No remarkable countermeasure such as that stated above has yet been utilized in the ADC of the counting type. However, in the field of the ADC of the sliding scale type Mr. E. Gatti et al has effectively improved the differential non-linearity as shown in U.S. Pat. No. 3,386,090.

The method improved by Gatti is not applied to any or prior ADC of the counting type without modification. If the Gatti method is forced to be applied thereto, no useful result is obtained. The reason is based on the fact that in the sliding scale type ADC the deviation in the accuracy of the elements that determine the analog quantity affects the differential non-linearity in the digital-to-analog converting (DAC) circuit which constitutes the ADC and the deviation exists constant and continuously in time as the deviation in the analog quantity. The countermeasure as shown in U.S. Pat. No. 3,386,090 is considered to be proper on the premise that a condition stated above exists.

On the contrary, in the counting type ADC of prior art, an interfering operation or action is left as a deviation at the moment when the conversion and counting terminates and, therefore, the mechanism of deviation generation is different with each other between the prior art counting type ADC and this invention.

Accordingly, even if an adding operation and a subtracting operation are effected by dividing the values shown in U.S. Pat. No. 3,386,090 into the analog value and the digital value, no averaging operation can be brought about nor the differential non-linearity can be improved.

SUMMARY OF THE INVENTION

When a histogram is obtained by summing up an extremely plural of inputs, the differential non-linearity is determined by characteristics in measurement at every times and in individual integration of plural measurement results which form the histogram, so this invention, accordingly, aims to improve the differential non-linearity by an averaging action of the measurement results statistically in the process of measurement. Therefore, this invention can be applied to such an instrument as the pulse-height analyzers in which the digital values obtained in the analog-to-digital converting method are summed up to be used in the form of a histogram.

As stated above, in the ADC method of the counting type, the operation of a scaler interferes with the clock-pulses to distort the period of the clock-pulses and the distortion occurring at an instance when an operation for counting the clock-pulses is completed is left as a deviation in the appearance of probability of the digital values so that the differential non-linearity of a histogram is deteriorated.

In this invention, in order to improve the deterioration, an arbitrary value is preset in a scaler as an offset prior to effecting a conversion and counting and the conversion and counting is effected by time signals and, thereafter, a value the same as the preset value is digitally added after the conversion and counting to the scaler in a direction in that the preset value is cancelled. The differential non-linearity is actually improved by varying the preset value every cycle of conversion and counting.

The object of this invention is to provide an ADC method with high speed and high accuracy in which the deterioration in the differential non-linearity in an ADC method of the counting type of the prior art is improved with a high speed operation of the clock-pulses and the differential non-linearity is kept in a high degree of accuracy.

In this invention, the differential non-linearity is not improved by only one measurement concerning one input but improved statistically by summing up a plurality of results of input as a histogram.

DESCRIPTION OF THE PREFERRED EMBODIMENTS

Figure 3:
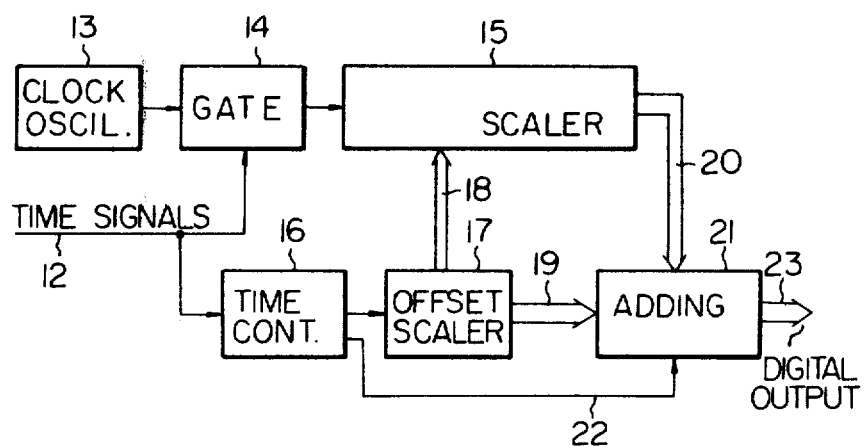
FIG. 3 is a block diagram explaining the construction in principle of the time-to-digital converting method of this invention.

In the block diagram in FIG. 3, a terminal 12 is connected to a gate 14 and a timing control circuit 16. The output end of a clock oscillator 13 is connected to gate 14 and the output end of gate 14 is connected to a scaler 15. The output end of timing control circuit 16 is connected to an offset scaler 17 and an adding circuit 21 and the output end of offset scaler 17 is connected to scaler 15 and adding circuit 21. The output end of scaler 15 is also connected to adding circuit 21.

Figure 4:
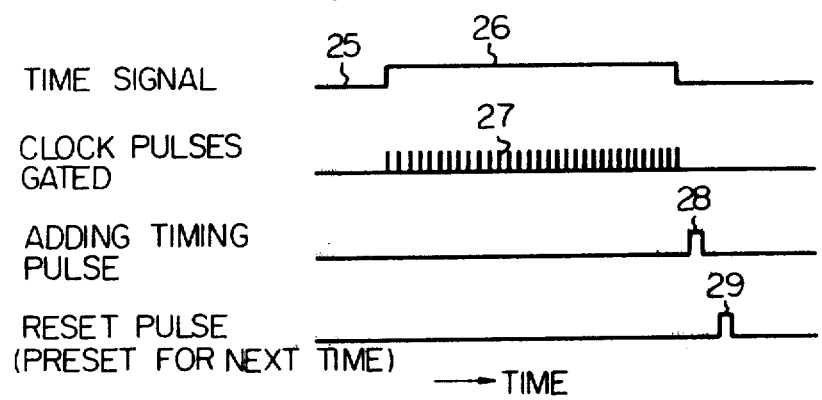
FIG. 4 is a diagram explaining the operation timing in the method explained in FIG. 2.

The operation of the circuit shown in FIG. 3 is explained as follows: input time signals are obtained from an analog-to-time converting circuit at terminal 12 and the input time signals are applied to gate 14 and timing control circuit 16. Clock-pulses coming from clock oscillator 13 are applied to gate 14 and gated by the input time signals. A clock-pulse train is sent to scaler 15 during only the effective duration of the input time signals. The time relations are shown in FIG. 4 and the clock-pulses can pass through scaler 15 by effective duration 26 of input time signals 25 and a train of clock-pulses 27 is counted by scaler 15. Prior to the counting, by applying a value predetermined by offset scaler 17 to scaler 15 through a line 18 and by presetting scaler 15, the counting of the clock-pulses begins from the preset value.

When effective duration 26 of input time signals 25 terminates gate 14 closes to terminate the train of clock-pulses 27 and the counting scaler 15. Thereafter, the value counted in scaler 15 is added to adding circuit 21 through a line 20. Meanwhile a value equivalent to the offset value is also added to adding circuit 21 from offset scaler 17 through a line 19. In adding circuit 21, when the counting operation is completed by using an adding timing pulse 28 which is applied from timing control circuit 16 through a line 22 the value in offset scaler 17 is added to the value in scaler 15 so that the value preset by offset scaler 17 is cancelled from the counted value in scaler 15, and the result of addition is taken out as the final digital output through a line 23.

Offset scaler 17 is advanced to the next value by timing control circuit 16 under the control of the timing of a reset pulse 29 and another new value in offset scaler 17 is preset in scaler 15 as a new offset for use in the next counting. Thereafter, the operations above stated are repeated at every counting.

Figure 5:
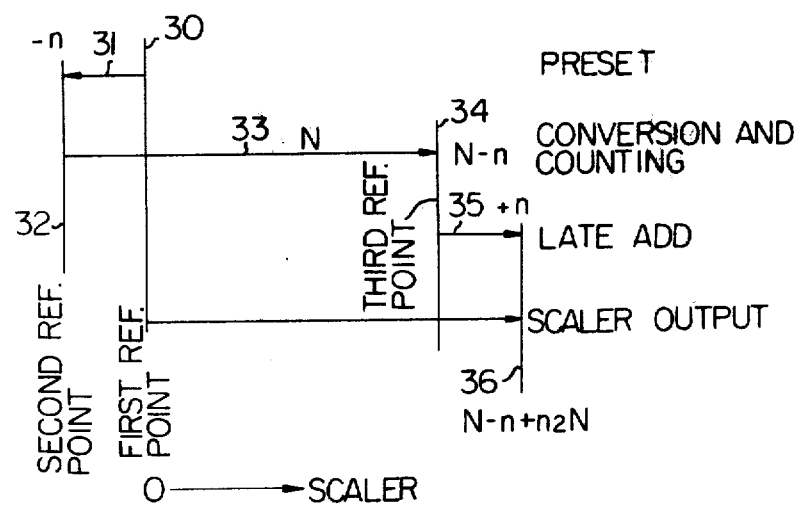
FIG. 5 is a diagram explaining the relationship between the value set in the scaler and the value obtained as the result of the counting, in the method explained in FIG. 2.

The diagram shown in FIG. 5 shows digitally the relationship above stated. In the figure, a first reference point 30 given in the numerical value is set as a zero point, a first preset value 31 is added in the negative direction as $-n$ and a counting operation begins from a second reference 32 which corresponds to a value $-n$. A third reference 34 is obtained by conversion and counting a numerical value 33 which is to be added as the result of the conversion and counting operation in the positive direction as N. After the conversion and counting operation terminates, a late-add numerical value 35 which equals in the absolute value to first preset value 31 is added to third reference 34 in the positive direction as $+n$ to provide finally a numerical value 36. Numerical value 36 thus obtained is the same as N which is due to the conversion and counting operation as the result of $-n+N+n=N$, so n is cancelled as an offset value and does not appear in the output.

An offset value is thus preset before the conversion and counting operation and is late-added. The offset value is varied each conversion cycle so the numerical value when the scaler is stopped at the termination of the conversion and counting operation is not determined by N but determined by $N-n$ which is a value in which the offset value is included. Accordingly, N has statistically no fixed relation to the values of the scaler by varying $-n$ cyclically by means of offset scaler 17 within a proper range and the N which is finally obtained as the output from the scaler can average the affect of period of the clock-pulses thus to improve the differential non-linearity.

Figure 6:
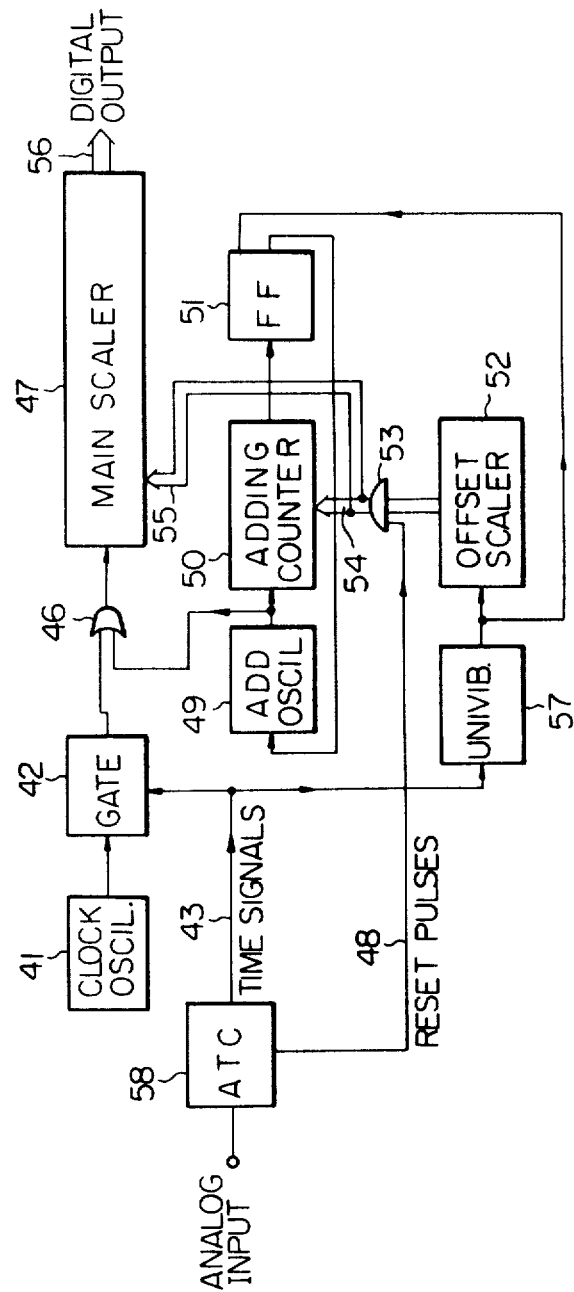
FIG. 6 is a block diagram explaining the fundamental construction of an embodiment of the time-to-digital converting method of this invention.

In the embodiment of this invention shown in FIG. 6, the timing control circuit shown in FIG. 3 is exemplified. In the figure, an offset scaler 52 and an adding counter 50, which is set at counting values the same as those of offset scaler 52 are constructed by scalers having a counting capacity corresponding to the predetermined offset value and, more generally, are constructed by a binary-one order (the offset value is two), by a binary-two orders (the offset value is four) or by a binary-three orders (the offset value is eight) and the like.

At first, offset scaler 52 has an arbitrary counting value and when a first reset pulse coming from a terminal 48 is applied, the value in offset scaler 52 is preset in adding counter 50 and a main scaler 47 from reset AND gates 53. The circuit is so constructed that the value which is preset in main scaler 47 is a complement to the value in offset scaler 52. A digital offset corresponding to a negative value can thus be provided, as explained in FIG. 5. Further, the value set in adding counter 50 is constructed to be the value in offset scaler 52 as it is.

When input time signals are applied from an analog-to-time conversion circuit 58 at a line 43 at the next time, a gate 42 opens and the clock-pulses provided in a clock oscillator 41 are applied to main scaler 47 through an OR gate 46 to start conversion and counting in main scaler 47. When the input time signals terminate and gate 42 closes, the counting in main scaler 47 once also stops. At the end point of the input time signals a univibrator 57 operates to advance offset scaler 52 to a new value by one step and, at the same time, to reset an overflow flip-flop (FF) 51 to release locking of an adding oscillator 49 and the oscillation starts.

As the result, an adding pulse is generated and adding counter 50 and main scaler 47 effect a late-adding operation. This late-adding operation corresponds to the operation of adding circuit 21 shown in FIG. 3, in which an action for cancelling the value which is substantially preset in the negative when the preset is effected by the counting operation. A value that is existing in offset scaler 52 is set in adding counter 50 as stated above and as adding counter 50 operates in a subtraction direction to reach a counting value of zero, an overflow is brought about at the next pulse to set overflow FF51 and to stop adding oscillator 49. The pulses counted during this operation become a value that is a sum of the value of offset scaler 52 plus 1. A late-adding operation by the sum is effected to cancel the value preset in main scaler 47. Digital countings corresponding to the input time signals which are obtained in the main countings is finally obtained.

At the next cycle, offset scaler 52 assumes a new value and another offset which is different from the previous one is effected and the operations similar to the previous ones are repeated.

Figure 7:
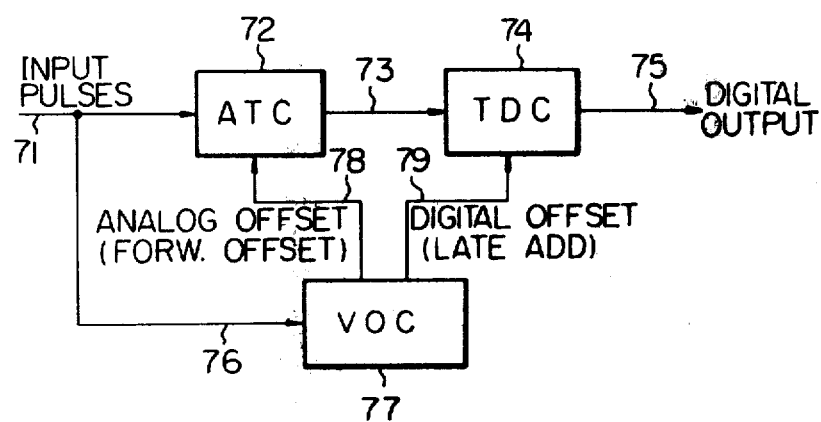
FIG. 7 is a block diagram showing the fundamental construction of the analog-to-digital converter to which the time-to-digital converting method of this invention is applied.

FIG. 7 shows the fundamental construction of an application of a time-to-digial converting (TDC) method to an analog-to-digital converter. In FIG. 7, terminal 71 to which analog input pulses are applied is connected to an analog-to-time converting (ATC) circuit 72 and a variable offset control (VOC) circuit 77. The output from VOC77 is connected to ATC72 and a time-to-digital converting (TDC) circuit 74. ATC72 is also connected to TDC74 and an output is taken out of TDC74.

In FIG. 7, analog input pulses are applied to ATC72, where an analog offset is given from VOC77 through a line 78. A waveform, which is a sum of the analog input pulses and the analog offset, is converted into the analog information by ATC72. This analog information is a sum of an analog information which corresponds to the pulse-height (analog value) of the analog input pulses and an analog information which corresponds to the analog offset (variable). ATC72 operates as follows: a capacitance (not shown in the drawing) in ATC72 is charged by peak value of the waveform to keep the voltage that is once in the capacitance. The voltage thus charged is discharged from a time at a constant rate in accordance with a ramp waveform to obtain a time signal as the duration to another time where it reaches a reference level. The time signal is represented by a time information which has a value corresponding to the analog information which is the sum of the analog information which corresponds to the pulse-height of the analog input pulses and the analog information which corresponds to the analog offset.

The time signal is applied to TDC74 through a line 73 to gate the clock-pulses and passes a pulse train only during the period that the time signal exists to provide a digital information by being counted by the scaler. The digital information corresponds to the sum of the analog information and the time information and a fixed relationship exists among the three.

A digital offset 81 is applied through a line 79 to the digital information that is once obtained in TDC74 to provide a new pulse train which is counted by the scaler. In the embodiment shown in FIG. 7, the digital offset is counted to be a numerical negative value and, therefore, a final digital information corresponding to the analog information in the analog input pulses is obtained in the scaler.

The operation above stated is referred to a case where one input pulse is applied to. However, values different from the preceeding ones are applied by VOC77 as the analog offset and the digital offset for the succeeding input pulse so that the sum of the analog information that effects conversion in ATC72 varies continually for the specialized analog input pulses by giving each of the two offset values different values every time. Accordingly, the time information and the digital information vary every time according to the sum of the analog information and, therefore, the non-uniformity of the channel width due to an action of interference from induction and etc. is made uniform over the range of an offset by giving a variable offset to the digital information obtained in TDC74 and the non-uniformity is finally not brought about.

In the embodiments of this invention shown in from FIG. 3 to FIG. 6, has been utilized a fundamental operation in that an offset is applied to prior to the conversion and counting of the clock-pulses by means of the time signals and a late-addition is effected for cancelling. A variety of concrete applications of the fundamental operation are considered.

It is the most appropriate method to preset in the main scaler values of the offset scaler so digital values at the reset time of the main scaler, for a method of application of offset prior to the conversion and counting, but the preset may be effected by utilizing the function of the counting in the main scaler by means of the counting operation.

As the late-adding operation to be effected after the conversion and counting, either of the two methods may be possibly utilized, one method being a method in which the values of the main scaler are added in parallel to the values of the offset scaler by means of the adding circuit, as shown in FIG. 3 and the other being a method in which the two kinds of values are added by means of the counting operation as shown in FIG. 6.

In the embodiment, is explained a method in which a negative preset is applied as the method of providing a relationship for dividing the offset value into the preset value and the late-add value and the negative preset is cancelled by adding a posotive adding value. In addition to it, it is sufficient in the application of the method of this invention to make the sum of the preset value and the late-add value constant at all times. For example, if the maximum of the preset value is 8, the preset value of a number selected from 0 to 7 is sequentially applied to and the late-add value of a complement to the existing preset value is used. Under this circumstance, the sum of the preset value and the late-add value is always left as a constant offset but the constant offset left is cancelled by any other means.

Furthermore, in the explanation is shown a method of varying the offset value in which the offset value advances by one every other operation by means of an offset scaler but the value in the offset scaler is not necessarily to be a sequentially varying value but a random number which is varying within a predetermined range. A fear of causing beat phenomena is eliminated between the time signals and the offset values when the incoming cycle of the time signal and the variation in the time are varying periodically and, therefore, the offset values are accordingly varying periodically, by varying the offset values as stated above.

Figure 1:
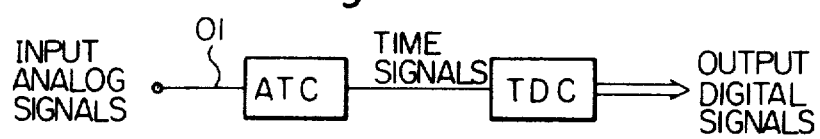
FIG. 1 is a block diagram explaining the analog-to-digital converting method of the prior art.
Figure 2:
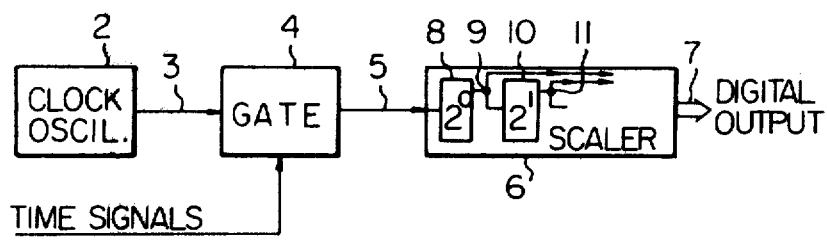
FIG. 2 is a block diagram explaining the time-to-digital converting method of the prior art.

As the method for applying an offset prior to the conversion and counting operation, it is explained that a digital value is applied as the offset. However, in addition to it an analog value can be applied by making the minimum value of the digital signals as a unit in lieu of the digital value. According to the construction of the analog-to-digital converter, as shown in FIG. 1, an ATC circuit is provided before a TDC circuit and the offset that is to be applied to previously can be applied to the ATC.

The construction stated above is exemplified in FIG. 7. In this example, the values from offset scaler 17 in FIG. 3 and offset scaler 52 in FIG. 6 are converted to analog values by making the minimum value of the values of the digital signals as a unit by means of a digital-to-analog converter (DAC) and the analog values are applied to ATC72 to be added to the analog quantity of the input pulses. By converting the analog signals that is the sum of the input pulses and the offset to time signals, a condition the same as that where digital values are preset is obtained. In order to cancel the preset value, a late-add operation is effected as the method shown in FIGS. 3 and 6 operates after the completion of the conversion and counting operation and an averaging operation can be obtained in the differential non-linearity by the late-add operation.

Under this condition a basic difference of the method of this invention stated above from the Gatti's method is that the digital offset is applied to after the completion of the conversion and counting operation in TDC74. In the Gatti's method that is referred to as the ADC of the sliding scale type, the operational principle is basically different from the method of this invention and no circuit is provided corresponding to TDC74. The location where the digital offset is applied to is also different between the two. As an alternative, the digital offset can be applied to the main scaler in TDC74 prior to the conversion and counting operation through a basic comprehension of Gatti's method and application thereof. However, in this invention by the prior application of the digital offset the diverging effect of the deviation will be lost in the interfering operation. Therefore, the main difference of this invention over the Gatti's method is that the digital offset should be applied to after the conversion and counting operation.

I claim:

1. An analog-to-digital converting method comprising:
    generating time signals proportionately based on analog input signals by means of an analog-to-time converting circuit;
    gating clock-pulses coming from a clock oscillator during the interval of each of said time signals;
    counting a train of the clock-pulses gated during each time signal by means of a main scaler;
    generating at random an offset scaler value for each train of said clock pulses, said offset scaler value randomly varied within a predetermined range at each conversion cycle corresponding to each time signal;
    applying the offset scaler value to the main scaler as an offset prior to arrival of the time signals; and
    obtaining a digital output from the value of the main scaler after termination of counting of the clock-pulses in the main scaler, said obtaining step compressing cancelling the offset scaler value applied to said main scaler by means of an adding circuit.

2. The analog-to-digital converting method recited in claim 1 wherein the applying step includes:
   applying by preset operation a value in the offset scaler to the main scaler as an offset prior to arrival of the time signals.

3. The analog-to-digital coverting method recited in claim 1 wherein the applying step includes:
   applying by counting operation a value in the offset scaler to the main scaler as an offset prior to arrival of the time signals.

4. The analog-to-digital converting method recited in claim 1 wherein the applying step includes:
   cancelling the offset by an operation in said adding circuit so as to add a value that equals the complement with the proper constant upper limit of the offset value to the counted value of said main scaler.

5. The analog-to-digital converting method recited in claim 1 wherein the applying step includes:
   cancelling the offset by a counting operation in said main scaler.

* * * * *